United States Patent
Gu et al.

(10) Patent No.: US 10,015,917 B2
(45) Date of Patent: Jul. 3, 2018

(54) MAGNETIC FIELD SHIELDING SYSTEM BASED ON CLOSED SUPERCONDUCTING COIL GROUPS AND MAGNETIC FIELD SHIELDING DEVICE

(71) Applicant: Tsinghua University, Beijing (CN)

(72) Inventors: Chen Gu, Beijing (CN); Si-Wei Chen, Beijing (CN); Ti-Ming Qu, Beijing (CN); Zheng-He Han, Beijing (CN)

(73) Assignee: Tsinghua University, Beijing (CN)

( * ) Notice: Subject to any disclaimer, the term of this patent is extended or adjusted under 35 U.S.C. 154(b) by 276 days.

(21) Appl. No.: 15/005,021

(22) Filed: Jan. 25, 2016

(65) Prior Publication Data

US 2016/0157396 A1    Jun. 2, 2016

Related U.S. Application Data

(63) Continuation of application No. PCT/CN2013/086013, filed on Oct. 25, 2013.

(30) Foreign Application Priority Data

Jul. 26, 2013 (CN) .......................... 2013 1 0318660
Jul. 26, 2013 (CN) .......................... 2013 1 0318686

(51) Int. Cl.
*H05K 9/00* (2006.01)

(52) U.S. Cl.
CPC ......... *H05K 9/0077* (2013.01); *H05K 9/0052* (2013.01)

(58) Field of Classification Search
CPC ................................................. H05K 9/0077
See application file for complete search history.

(56) References Cited

U.S. PATENT DOCUMENTS

2014/0087953 A1\* 3/2014 Bromberg ............... H05H 7/00
505/200

FOREIGN PATENT DOCUMENTS

| CN | 101107680 | 5/2010 |
|---|---|---|
| CN | 103065758 | 4/2013 |

\* cited by examiner

*Primary Examiner* — Ramon M Barrera

(57) ABSTRACT

A magnetic field shielding system includes a first stage superconducting coil and a second stage superconducting coil. The first stage superconducting coil and the second stage superconducting coil are coaxial, coplanar and electrically connected in series to form a closed loop; the first stage superconducting coil has a first radius R1, the second stage superconducting coil has a second radius R2, and R1>R2; a radius ratio α between the first radius R1 and the second radius R2 is: α=R1/R2; the first stage superconducting coil has N1 turns; the second stage superconducting coil has N2 turns; a turns ratio β between N1 and N2 is: β=N1/N2; and the radius ratio α satisfies: α≥2; the turns ratio β satisfies: 0.01≤β≤20.

19 Claims, 20 Drawing Sheets

MAGNETIC FIELD SHIELDING SYSTEM BASED ON CLOSED SUPERCONDUCTING COIL GROUPS AND MAGNETIC FIELD SHIELDING DEVICE

CROSS-REFERENCE TO RELATED APPLICATIONS

This application claims all benefits accruing under 35 U.S.C. § 119 from China Patent Application No. 201310318660.X, filed on Jul. 26, 2013, and China Patent Application No. 201310318686.4, filed on Jul. 26, 2013 in the China Intellectual Property Office, the content of which is hereby incorporated by reference. This application is a continuation under 35 U.S.C. § 120 of international patent application PCT/CN2013/086013 filed Oct. 25, 2013.

FIELD

The present invention belongs to the field of superconducting electrical engineering, especially relates to a passive type magnetic field shielding system based on closed superconducting coil groups and magnetic field shielding device.

Magnetic shielding technology is a common security technology in many sophisticated scientific techniques. In some extreme measurement environment, such as high-precision atomic electron beam imaging device, mass spectrometer, and detection of neutrinos, it has been widely applied. With the complex of electromagnetic environment increasing, the magnetic shielding technology plays an important role in the field of bio-magnetic measurement technology. In biomagnetic measurements, the test signal in a scale of 10 pT ($1\times10^{-11}$T) or even lower. The ambient noise magnetic field is 3-6 orders larger than it. Thus canceling noise signal becomes an essential part of such measurements. In addition to the use of filtering and signal processing software approach to eliminate noise magnetic field, the shielding hardware is the most direct way. The shielding hardware has basically become an indispensable biomagnetic measurement supporting devices.

At present, there are two manners commonly used in magnetic shielding: passive type shielding technology and active type shielding technology. The passive type shielding technology is one of the oldest technologies in application. The passive type shielding system uses high-permeability material to build a closed chamber to enclose the protected object. The higher the shield cavity material is, the thicker the tube wall is, and the more significant the shielding effect will be. The common high magnetic permeability material can be soft iron, silicon steel, or permalloy. For example, at present, a traditional shielding system with closed coil group structure of a superconducting Helmholtz (Helmholtz) is provided. Its basic structure is a Helmholtz coil of superconducting electrical group by a specific radius ratio with special distance.

However, the shielding system should be based on the Helmholtz coil group structure in order to achieve the shielding effect, and requires that all the four Helmholtz coils should be connected together. In addition, in order to obtain the shielding device, it is much more complicate to obtain the radius ratio and turns ratio. Furthermore, it is difficult to connect the four Helmholtz coils. Thus the manufacturing process is complicated, and it is inconvenient for engineering practice.

What is needed, therefore, is to provide a magnetic field shielding system and magnetic field shielding device that can overcome the above-described shortcomings.

BRIEF DESCRIPTION OF THE DRAWINGS

Implementations are described by way of example only with reference to the attached figures.

DETAILED DESCRIPTION

Figure 1:
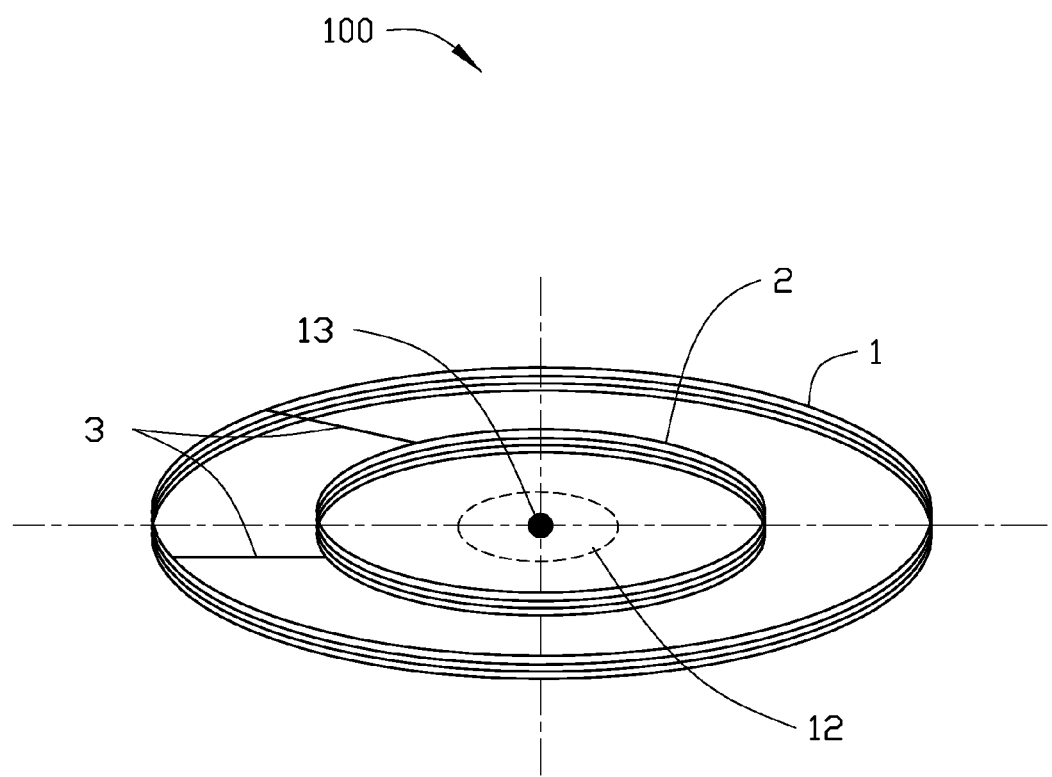
FIG. 1 shows a schematic view of one embodiment of a magnetic filed shielding system.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "comprise" or "comprising" when utilized, means "comprise or including, but not necessarily limited to"; it specifically indicates open-ended inclusion or membership in the so-described combination, group, series, and the like. The term "join" or "joining" when utilized, means "directly connect or connected by chemical bond."

Referring to FIG. 1, one embodiment of a magnetic filed shielding system 100 comprises a first stage superconducting coil 1 and a second stage superconducting coil 2. The first stage superconducting coil 1 and the second stage superconducting coil 2 are coaxial and coplanar. The first stage superconducting coil 1 and the second stage superconducting coil 2 are electrically connected in series to form a closed loop. A uniform field region 12 is formed in an internal space within the second stage superconducting coil 2 to shield an external magnetic field.

Both the first stage superconducting coil 1 and the second stage superconducting coil 2 have regular geometric shape, such as circular, oval, rectangular, square, or other regular polygons. The first stage superconducting coil 1 and the second stage superconducting coil 2 can have the same shape or different geometry. In one embodiment, both the first stage superconducting coil 1 and second superconducting coil 2 have the same geometry. The first stage superconducting coil 1 and the second stage superconducting coil are combined together to form a closed superconducting coil group. The size (diameter or side length) of the first stage superconducting coil 1 is larger than the second stage superconducting coil 2. In one embodiment, both the first stage superconducting coil 1 and the second stage superconducting coil 2 are circular. The first stage superconducting coil 1 and the second stage superconducting coil 2 are coaxially disposed. Both the first stage superconducting coil 1 and second stage superconducting coil 2 are symmetrically located around the same central axis. Both the center of the first stage superconducting coil 1 and the center of the second stage superconducting coil 2 are located at the central axis. In one embodiment, the first stage superconducting coil 1 and the second stage superconducting coil 2 are circular, concentric, and coplanar.

Both the first stage superconducting coil 1 and the second stage superconducting coil 2 comprise a plurality of coils. The first stage superconducting coil 1 and the second stage superconducting coil 2 can comprise the same superconducting material. The superconducting material may be yttrium-based YBCO ($YBa_2Cu_3O_{7-x}$) or bismuth-based BSCCO such as Bi2223, Bi2212. In one embodiment, the material of the first stage superconducting coil 1 and the second stage superconducting coil 2 are the same. In one embodiment, the material of both the first stage superconducting coil 1 and the second stage superconducting coil 2 is high temperature superconducting material Bi2223.

Furthermore, both the first stage superconducting coil 1 and second stage superconducting coil 2 are formed by a single superconducting wire spiral wounded around a central symmetry axis. In one embodiment, the superconducting wire can be spirally surrounded from the inner to the outer in one plane to form a pancake-shaped coil. In another embodiment, the superconducting wire can also be spirally surrounded with same diameter, and the plurality of coils are stacked together to form a solenoid-shaped coil. Furthermore, the first stage superconducting coil 1 and second stage superconducting coil 2 can have different structure or same structure.

In one embodiment, the first stage superconducting coil 1 comprises a plurality of first coils stacked together. Similarly, the second stage superconducting coil 2 comprises a plurality of second coils stack together. The first stage superconducting coil 1 can be electrically connected with the second stage superconducting coil 2 in series via a connecting wire 3. In detail, the first stage superconducting coil 1 comprises a first end and a second end, and the second stage superconducting coil 2 comprises a third end and a fourth end. The first end is electrically connected to the second end via one connecting wire, and the second end is electrically connected to the fourth end via another connecting wire. Therefore, the first stage superconducting coil 1 and the second stage superconducting coil 2 form a closed loop. The first stage superconducting coil 1 and the second stage superconducting coil 2 can be electrically connected to the connecting wire 3 via a conventional soldering techniques.

The first stage superconducting coil 1 has a first radius R1, the second stage superconducting coil 2 has a second radius R2, and R1>R2. The radius ratio $\alpha$ between the first radius R1 and the second radius R2 is: $\alpha=R1/R2$. The first stage superconducting coil 1 has N1 turns, and the second stage superconducting coil 2 has N2 turns. The turns ratio $\beta$ between N1 and N2 is: $\beta=N1/N2$. The shielding effect formed by the first stage superconducting coil 1 and the second stage superconducting coil 2 depends on the radius ratio $\alpha$ and the turns ratio $\beta$. In one embodiment, the radius ratio $\alpha$ satisfies: $\alpha \geq 2$; the turns ratio $\beta$ satisfies: $0.01 \leq \beta \leq 20$. Therefore, the magnetic field shielding system 100 has great shielding effect, and the magnetic field shielding system 100 can shield more than 90% of the original magnetic filed.

According to the different requirement of different magnetic shielding objects, $\alpha$, $\beta$, N1, and N2 can be calculated by the following steps:

Step S10, determining the second radius R2 according to the geometry of the object, and estimating ranges of the radius ratio $\alpha$ and turns ratio $\beta$;

Step S20, preliminary determining the ranges of the radius ratio $\alpha$ and turns ratio $\beta$, and calculating the specific radius ratio $\alpha$ and turns ratio $\beta$ through numerical simulation method;

Step S30, establishing a coordinate system of $\beta$ and $\alpha$, selecting a plurality of coordinates ($\beta$, $\alpha$) in the coordinate system, and connecting the plurality of coordinates ($\beta$, $\alpha$), wherein the turns ratio $\beta$ is taken as the abscissa, and the radius ratio $\alpha$ is taken as the ordinate; the plurality of coordinates ($\beta$, $\alpha$) enable (($B_0$-$B_1$)/$B_0$<K), wherein $B_0$ is a ac change magnetic field strength, $B_1$ is magnetic field strength at the central point 13 in the uniform magnetic field, K is a required magnetic shielding effect of the magnetic filed shielding system 100; and Step S40, determining $N_1$ and $N_2$ according to the radius ratio $\alpha$ and the turns ratio $\beta$.

In step S10, the radius ratio $\alpha$ is greater than 1 in the magnetic field shielding system 100. In one embodiment, a is greater than or equal to 2. In one embodiment, the second radius is about 50 mm. Furthermore, it is assumed that the turns ratio β ranged from 0.001 to 1000.

In step S20, the numerical simulation can be completed via the numerical finite software ANSYS. A cross-section of both the first stage superconducting coil 1 and the second stage superconducting coil 2 is set to rectangular with small resistivity. The R1, R2, N1, and N2 are also set. The first stage superconducting coil 1 and the second stage superconducting coil 2 are electrically connected in series. The two opposite ends of the first stage superconducting coil 1 is electrically connected to the two opposite ends of the second stage superconducting coil 2 respectively to form the closed loop. The amplitude of applied AC magnetic field is set to $B_0$. In one embodiment, the AC magnetic field is sinusoidal AC magnetic field with a frequency of 50 Hz. With the radius ratio α ranging from 1 to 20, the radius ratio α is scanned with a step length of 0.1. Once changing the radius ratio α, the turns ratio β is scanned with a step length of 0.1 from 0.001-1000. At each (β, α), the magnetic field strength $B_1$ at a midline point 13 in the uniform field region 12 is simulated and calculated.

Figure 2:
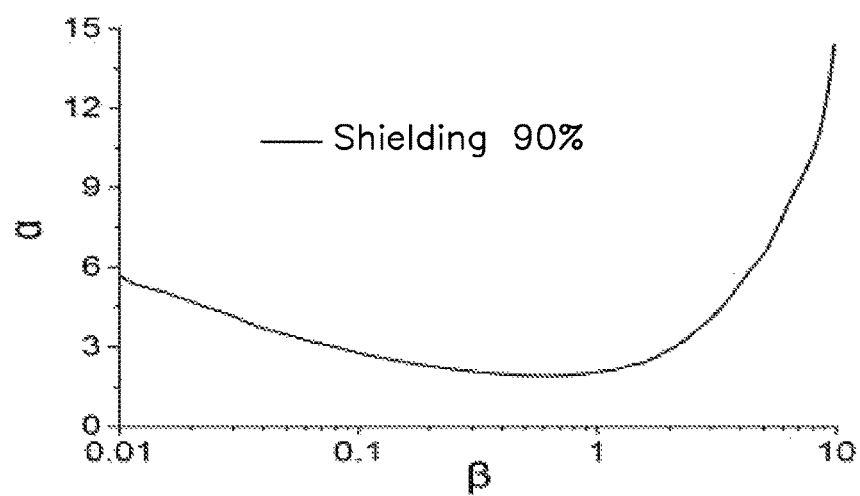
FIG. 2 shows a schematic graph of one embodiment of values ($\alpha$, $\beta$) at shielding 90% magnetic field conditions.

In the step S30, after all the (β, α) in the coordinate system are successfully labeled and connected to form a curve, it is indicated that the designed and manufactured magnetic filed shielding system according to the (β, α) on the curve, can meet the requirement that the magnetic filed shielding system can shield 100(1−K) % of the original magnetic field. In one embodiment, K is set to 0.1, and the magnetic field shielding system 100 needs to shield 90% of the original magnetic field. Referring to FIG. 2, the (β, α) at the curve in the FIG. 2 can reach the target of 90%. Furthermore, although all the (β, α) on the curve can meet shielding requirements of shielding 100(1−K) %, in terms of engineering, the radius ratio α and turns ratio β are not suitable to adopt large value. In one embodiment, the magnetic field shielding system 100 selects α=2.3, β=1.

In step S40, after the radius ratio α is determined, the second radius R2 can be selected according to the size of the protected object and compatibility. In one embodiment, R2=50 mm, R1=115 mm. In theory, the more turns of the second stage superconducting coil 2, the shielding effect will be better. But at the same time, the number of turns of wire means increased usage and cost. Thus, in order to meet the requirement of shielding effect, the minimum number of turns N2 of the second stage superconducting coil 2 can be calculated according to the following formula:

$$N2 > \sqrt{\frac{mR}{L\omega}};$$

wherein, R is a connecting resistance between the first stage superconducting coil 1 and second stage superconducting coil 2, L is an inductance of a single-turn coil of the second stage superconducting coil 2, ω is an angular frequency of the magnetic field, m is the ratio coefficient between ωL and R, and the larger the m is, the better the shielding effect. m>100. In one embodiment, m=1000. R equals to 100 nΩ. Because the frequency of the magnetic field to be shielded is not fixed, so ω can be determined based on the main frequency of the magnetic field. In one embodiment, ω takes 50 Hz. Thus N2 takes 10, and N1 also takes 10.

Figure 3:
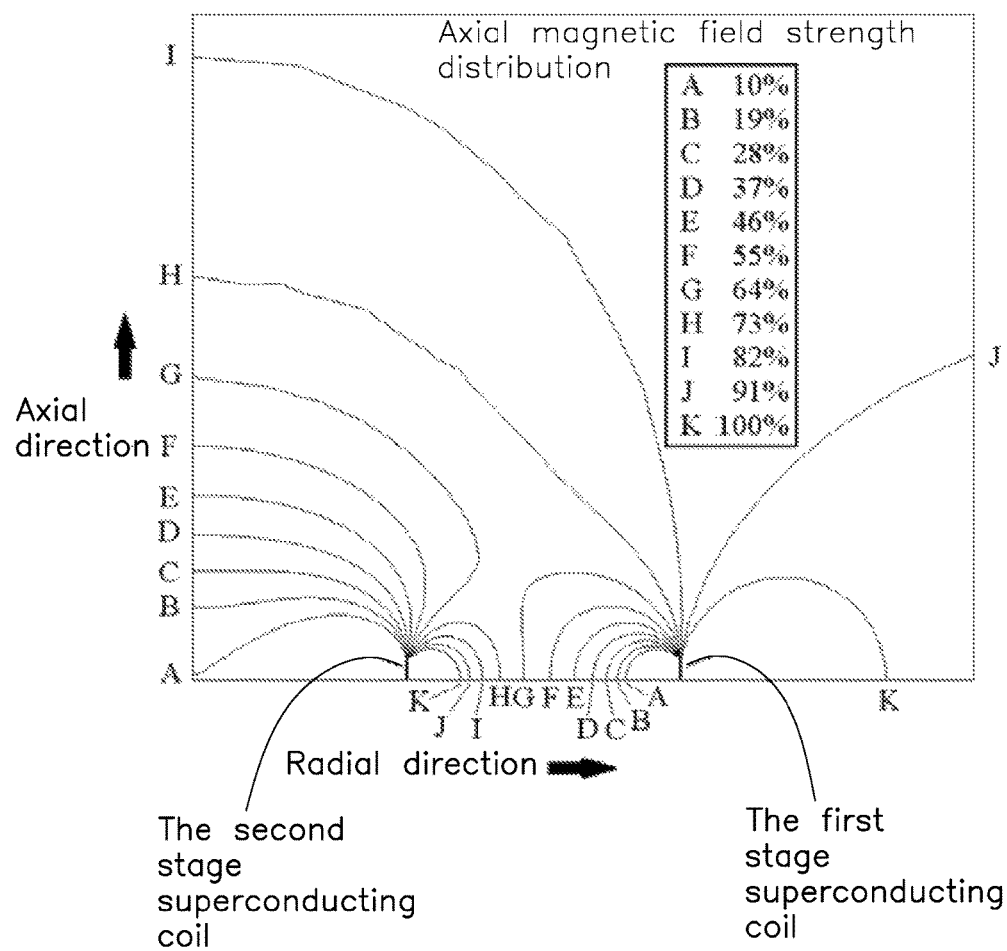
FIG. 3 shows a schematic graph of one embodiment of an effect of shielding noise magnetic field by the magnetic filed shielding system in FIG. 1.

Referring to FIG. 3, the shielding effect of the magnetic field shielding system 100 is shown under the conditions of R1=115 mm, R2=55 mm, N1=10, N2=10, the applied external magnetic field strength $B_0$=0.001T, ω3=50 Hz. In FIG. 3, the amplitude of the magnetic field is normalized. At the central position inside the second stage superconducting coil 2, the shielding ratio of the external magnetic field is greater than 90%. The parameters R1, N1, R2, and N2 form the basis for actually manufacturing magnetic filed shielding system 100.

Figure 4:
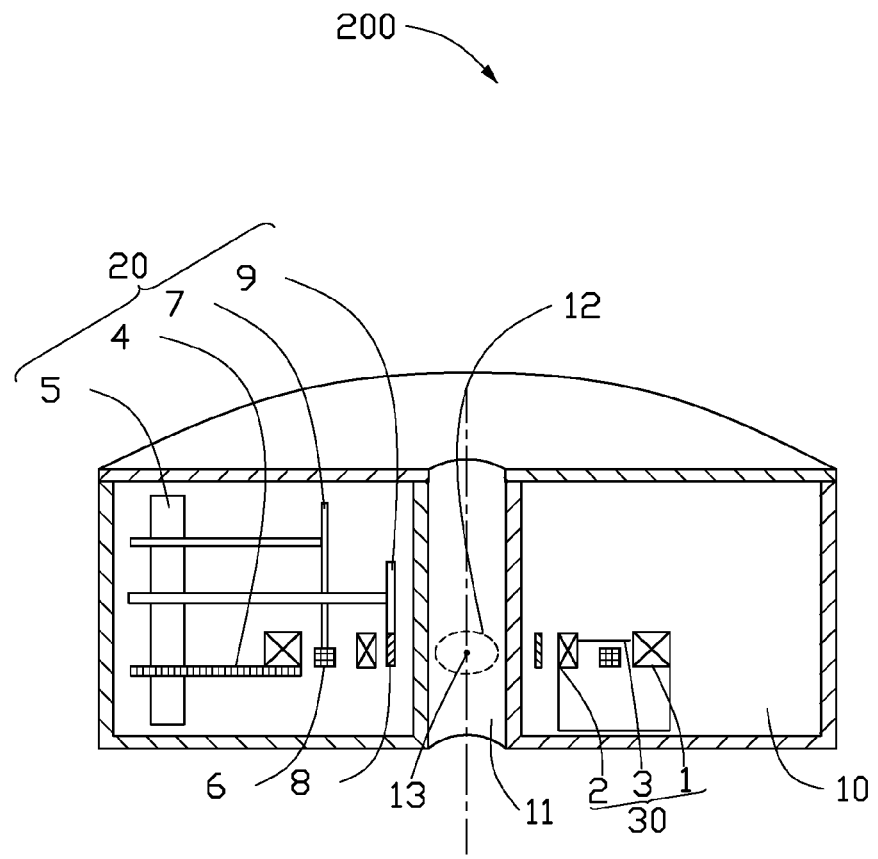
FIG. 4 shows a schematic view of one embodiment of a magnetic shielding device.

Referring to FIG. 4, one embodiment of a magnetic field shielding device 120 comprises a dewar 10, a magnetic field shielding system 30, and a adjustment module 20. The magnetic field shielding system 30 is located in the dewar 10.

The dewar 10 is a hollow cylindrical tubular structure comprising an inner wall and an outer wall around the same central symmetry axis. The dewar 10 defines a through hole penetrating along the central symmetry axis. The inner wall forms a room temperature cavity 11 to accommodate instrumentation or devices. The uniform filed region 12 of the magnetic field shielding system 30 is located inside the room temperature cavity 11. The space between the inner wall and the outer wall inside the dewar 10 forms the hollow structure which can be filled with cryogenic materials, such as liquid nitrogen. The magnetic field shielding system 30 is disposed inside the dewar 10 and located between the inner wall and outer wall.

The magnetic field shielding system 30 is same as the magnetic field shielding system 100. The magnetic field shielding system 30 comprises a first stage superconducting coil 1 and the second stage superconducting coil 2 located inside the dewar 10 and immersed in the cryogenic material. The first stage superconducting coil 1 and second stage superconducting coil 2 surrounds the room temperature cavity 11. In one embodiment, the first stage superconducting coil 1, the second stage superconducting coil 2, and the dewar 10 are coaxially disposed along the same central symmetry axis to shield the instrument or device.

Figure 5:
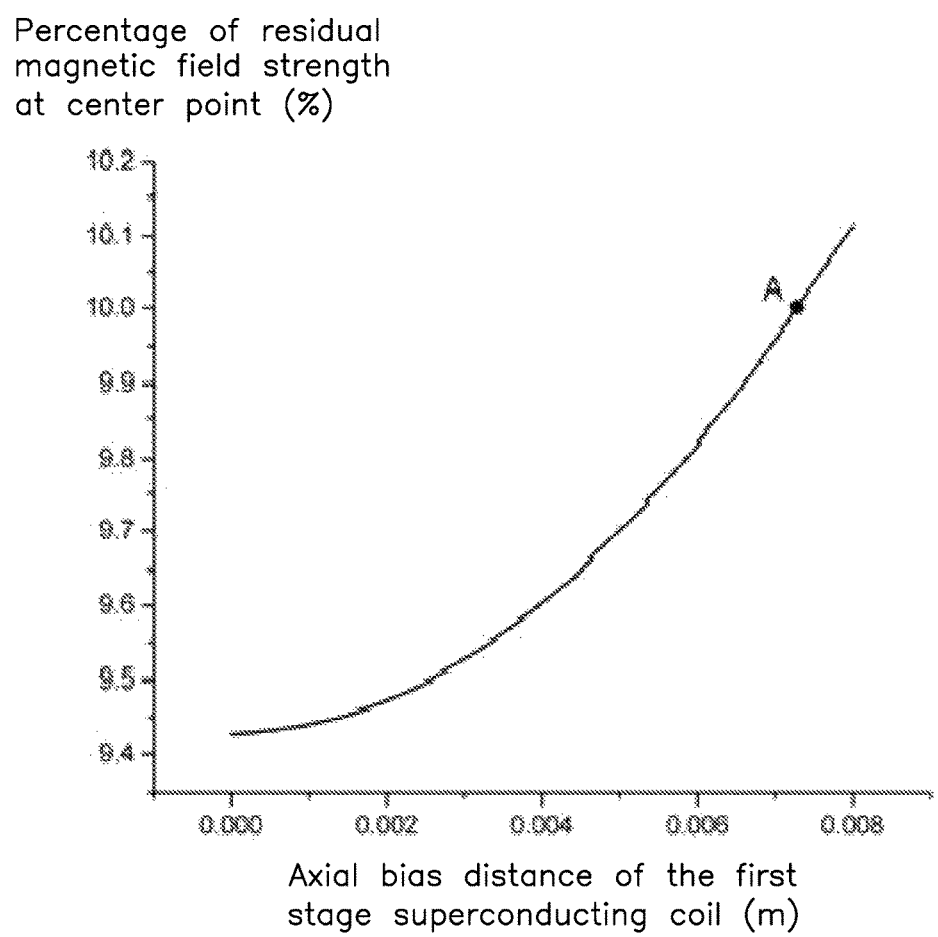
FIG. 5 shows a schematic graph of a shielding effect at center position of the magnetic shielding device while changing a relative position between a first stage superconducting coil and a second stage superconducting coil along an axial direction.

The adjustment module 20 is configure to support the first stage superconducting coil 1 and the second stage superconducting coil 2, and adjust the relative position of the first stage superconducting coil and second stage superconducting coil 2 along the central symmetry axis. In detail, the adjustment module 20 comprises a first connecting rod 4 and a linear bearing 5. The first connecting rod 4 is configured to support the first stage superconducting coil 1, and adjust the relative position between the first stage superconducting coil 1 and the second stage superconducting coil 2 along the central axis symmetry. By adjusting the linear bearing 5, the first connecting rod 4 and the first stage superconducting coil 1 can be axially moved, and the relative position between the first stage superconducting coil 1 and the second stage superconducting coil 2 along the central axis can be finely trimmed. Thus the mutual coupling coefficient between the first-stage superconducting coil 1 and the second stage superconducting coil 2 can be changed in order to achieve the best shielding effect. In one embodiment, the linear bearing 5 can be located at outside of the dewar 10. During the adjustment process, a magnetometer (not shown) can be placed at the central point 13 and applying a background alternating magnetic field. During adjusting the first connecting rod 4, the magnetometer is continuously read. While the result reaches the design index, the relative positions of the first stage superconducting coil 1 and the second stage superconducting coil 2 is locked. Referring to FIG. 5, the magnetic field shielding ratio at the center is varied with the movement of the first stage superconducting coil 1 along the axial direction. It is clearly shown that the shielding effect at the center by adjusting the relative position of the first stage superconducting coil 1. While the shielding effect reach the optimal point, such as the A point achieving 90%, the first stage superconducting coil 1 is locked, and relative position between the first superconducting coil 1 and the second superconducting coil 2 is fixed.

It can be understood that, during forming the first stage superconducting coil 1 and the second stage superconducting coil 2, because the first stage superconducting coil 1 and the second stage superconducting coil 2 have different turns, and the coil material has thermal expansion and contraction, thus coaxial and coplanar relationship between the first stage superconducting coil 1 and the second stage superconducting coil 2 may be slight affected. Furthermore, because of different specific requirement of the shielding effect, hence the first connecting rod 4 is needed to slightly adjust the relative position. However, the adjustment does not affect the first stage superconducting coil 1 and second stage superconducting coil 2 are coplanar. Thus the adjustment does not destroy the relative position between the first stage superconducting coil 1 and the second stage superconducting coil 2.

Furthermore, the magnetic field shielding system 30 can comprise a ferromagnetic dielectric ring 6, and the ferromagnetic dielectric ring 6, the first stage superconducting coil 1, and the second stage superconducting coil 2 are coaxially located along the same axis. In one embodiment, the ferromagnetic dielectric ring 6 can be located between the first stage superconducting coil 1 and the second superconducting coil 2. The size of the ferromagnetic dielectric ring 6, such as side length or radius, can be greater than the first stage superconducting coils 1 and smaller than the first stage superconducting coil 1. The ferromagnetic dielectric ring 6 can be a regular geometric shape. The ferromagnetic dielectric ring 6, the first stage superconducting coil 1, and the second stage superconducting coil 2 can have the same shape or different shape. In one embodiment, the ferromagnetic dielectric ring 6 is a circular ring. The ferromagnetic dielectric ring 6 can define a notch to prevent the formation of large current.

The adjustment module 20 can further comprises a second connecting rod 7 connected to the linear bearing 5 and the ferromagnetic dielectric ring 6, and control the axial movement of the ferromagnetic dielectric ring 6 along the central axis. By changing the relative position among the dielectric ferromagnetic dielectric ring 6, the first stage superconducting coil 1, and the second stage superconducting coil 2, the mutual coupling coefficient among the ferromagnetic dielectric ring 6, the first stage superconducting coil 1, and the second stage superconducting coil 2 can be changed to achieve the optimum shielding state. It can be understood that, in the case of satisfying the above conditions, the ferromagnetic dielectric ring 6 can be located inside the second stage superconducting coil 2, and the radius of the ferromagnetic dielectric ring 6 is smaller than the second radius of the second stage superconductive coil 2. Furthermore, the ferromagnetic dielectric ring 6 can also be located outside the first stage superconducting coil 1, and the radius of the ferromagnetic dielectric ring 6 is greater than first radius of the first stage superconducting coil 1.

Figure 6:
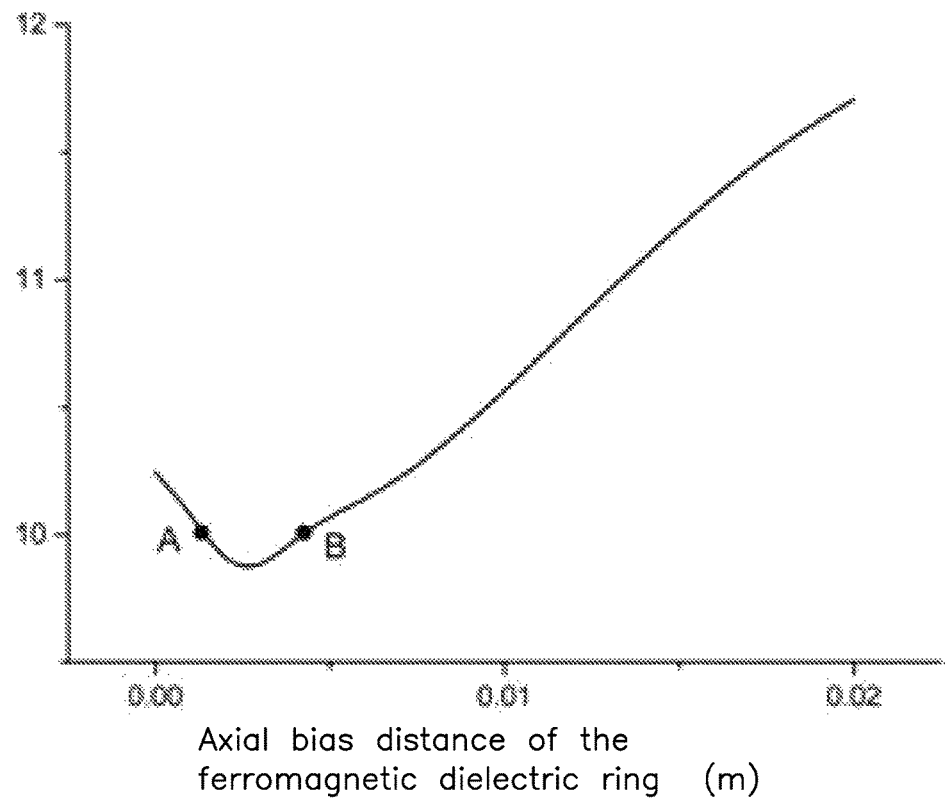
FIG. 6 shows a schematic graph of a shielding effect at center position of the magnetic shielding device with changing position of a ferromagnetic dielectric ring.

The material of the ferromagnetic dielectric ring 6 can be made of metal having high magnetic permeability, and the relative permeability is greater than 100. In one embodiment, the material of the ferromagnetic dielectric ring 6 is soft iron. The radius of the ferromagnetic dielectric ring 6 is greater than second radius and smaller than the first radius. In one embodiment, the radius of the ferromagnetic dielectric ring 6 is 60 mm, a thickness is 15 mm. Adjusting the ferromagnetic dielectric ring 6 moving along the axis, the shied effect at the central point 13 can be changed. As shown in FIG. 6, the shielding ratio at the central point 13 in the magnetic filed varies with the movement of the ferromagnetic dielectric ring 6. While the shielding ratio reaching the required shielding effect, such as points A or B, the ferromagnetic dielectric ring 6 is locked. Thus the relative position among the ferromagnetic dielectric ring 6, the first stage superconducting coil 1 and the second stage superconducting coil 2 will be fixed.

Figure 7:
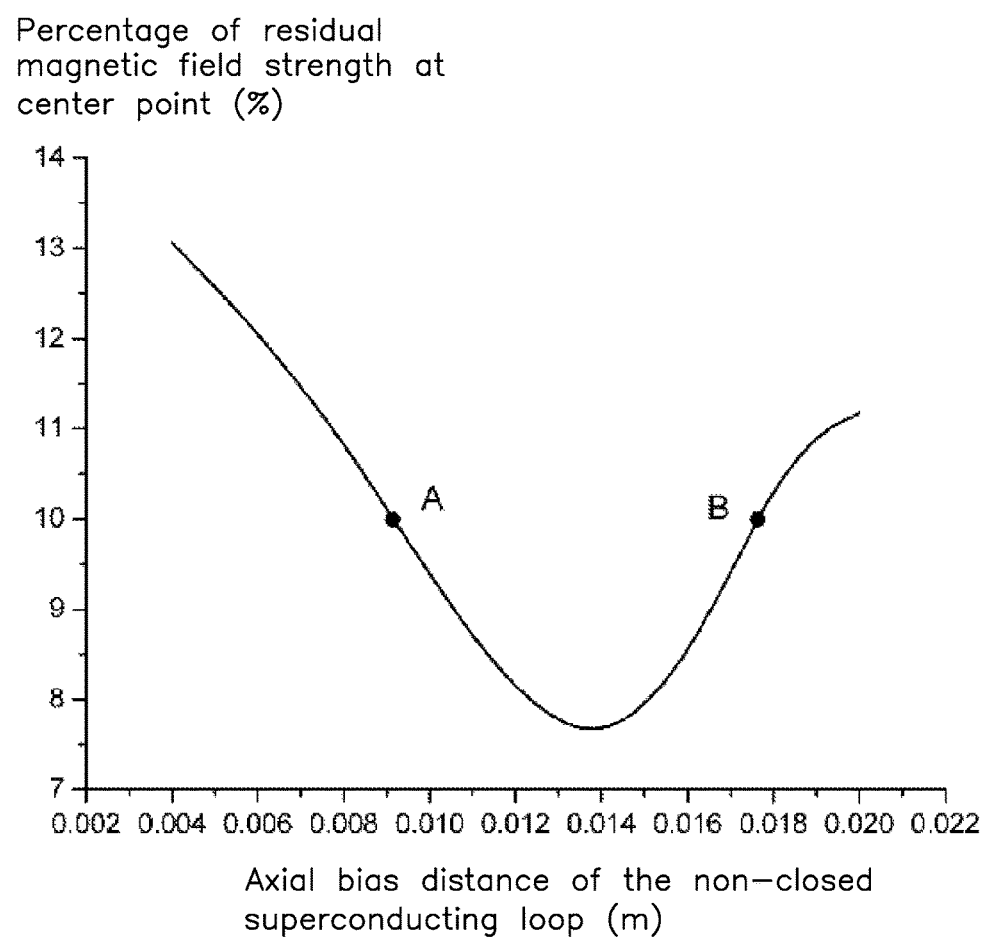
FIG. 7 shows a schematic graph of a shielding effect at center position of the magnetic shielding device with changing position of a non-closed superconducting loop.

Further, the ferromagnetic dielectric ring 6 can also be replaced by a non-closed superconducting loop. The non-closed superconducting loop also defines the notch to prevent the formation of large current. The material of the non-closed superconducting loop can be same as the first stage superconducting ring 1. While the ferromagnetic dielectric ring 6 is replaced by the non-closed superconducting loop, referring to FIG. 7, the shielding ratio at the central point 13 will be changed with the movement of the non-closed superconducting loop along the axis. The shielding effect of the magnetic field shielding system 30 can be adjusted. While the shielding ratio is adjusted to reach the required shielding effect, such as point A or B, the non-closed superconducting loop will be locked. Thus the relative position among the non-closed superconducting loop, the first stage superconducting coil 1 and the second stage superconducting coil 2 will be fixed.

Because during the actual manufacturing process, there might be some design deviations may occur to the first stage superconducting coil 1 and the second stage superconducting coil 2. Furthermore, the first stage superconducting coil 1 and the second stage superconducting coil 2 are placed in liquid nitrogen, the coils have the characteristic of thermal expansion and contraction, the actual radius of the coil may be biased compared to the designed radius and affect the shielding effect. By adjusting the ferromagnetic dielectric ring 6, the shielding effect of the magnetic field shielding system 30 can be further improved, and it is convenient to adjust the magnetic field shielding system 30.

Furthermore, the magnetic field shielding system 30 can comprise a closed superconducting loop 8 coaxially located with the first stage superconducting coil 1 and the second stage superconducting coil 2. The closed superconducting loop 8 can be located inside the second stage superconducting coil 2. A size (i.e., diameter, edge length) of the closed superconducting loop 8 is smaller than the second-stage superconducting coil 2. The shape of the superconducting closed shape ring 8 can same as or different from the first stage superconducting coil 1 and the second stage superconducting coil 2. In one embodiment, the shape of a closed superconducting loop 8 is circular. The closed superconducting loop 8 is an independent structure spaced and insulated from the first stage superconducting coil 1 and the second stage superconducting coil 2. The radius of the closed superconducting loop 8 is smaller than the second radius but greater than the room temperature cavity 11 or the size of the protected instrument, in order to reserve space for the instrument or object to be shielded. The closed superconducting loop 8 can have a single turn or multi-turns. In one embodiment, the closed superconducting loop 8 has the single turn. The material of the closed superconducting loop material 8 may be same as or different from the first stage superconducting coil 1.

Figure 8:
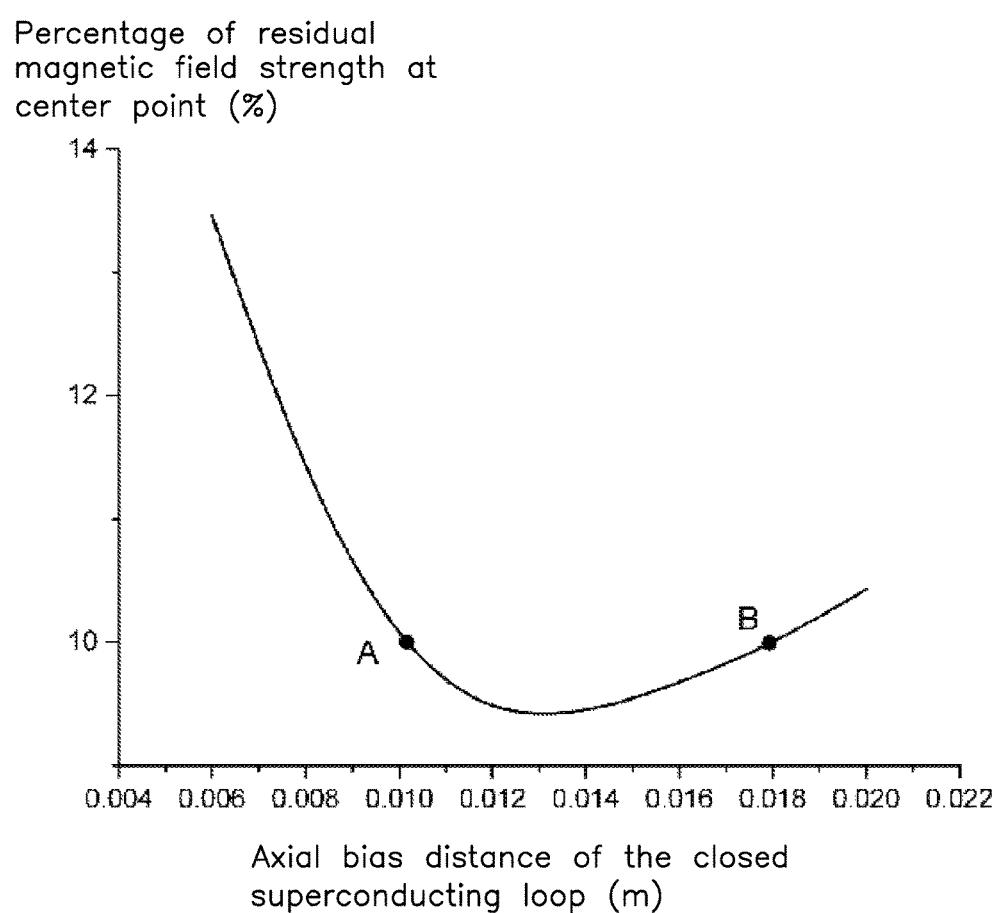
FIG. 8 shows a schematic graph of one embodiment of a shielding effect of the magnetic shielding device in FIG. 4 with changing position of a closed superconducting loop.

Furthermore, the adjustment module 20 can comprise a third connecting rod 9. The third connecting rod 9 is connected to the closed superconducting loop 8 to adjust the closed superconducting loop 8 axially moving along the central axis. In one embodiment, the closed superconducting loop 8 is connected to the linear bearing 5 via the third connecting rod 9. By changing the relative position among the closed superconducting loop 8, the first stage superconducting coil 1, and the second stage superconducting coil 2, the coupling relationship among the closed superconducting loop 8, the first stage superconducting coil 1, and the second stage superconducting coil 2 will be changed in order to achieve a better shielding effect. In one embodiment, the radius of the closed superconducting loop 8 is 25 mm. By adjusting the position of the closed superconducting loop 8, the magnetic field at the center point 13 can be recorded. Referring to FIG. 8, the magnetic shielding ratio at the center point 13 will be changed according to the movement of the closed superconducting loop 8. While the shielding ratio reaching the required shielding effect, such as point A or the point B, the closed superconducting loop 8 is locked. Thus the relative position among the closed superconducting loop 8, the first stage superconducting coil 1, and the second stage superconducting coil 2 can be fixed.

In addition, in the case of satisfying the above other conditions, the closed superconducting loop 8 can also be located between the first stage superconducting coil 1 and the second stage superconducting coil 2, and coaxially located with the first stage superconducting coil 1 and second stage superconducting coil 2. The radius of the closed superconducting loop 8 is greater than the first radius of the second stage superconducting coil 2, and smaller than the first stage superconducting coil 1. The closed superconducting loop 8 can also be placed on the outside of the first stage superconducting coil 1. The radius of the closed superconducting loop 8 is greater than the first stage superconducting coil 1.

Furthermore, the magnetic field shielding system 30 can simultaneously comprise both the ferromagnetic dielectric ring 6 and the closed superconducting loop 8. The ferromagnetic dielectric ring 6 can be located between the second stage superconducting coil 2 and the first stage superconducting coil 1. The closed superconducting loop 8 can be located inside the first stage superconducting coil 1. All the ferromagnetic dielectric ring 6, the closed superconducting loop 8, the first stage superconducting coil 1, and the second stage superconducting coil 2 are coaxially located. By changing the relative position between each other, thus the magnetic field shielding system 30 can have a better shielding effect. By adjusting the ferromagnetic dielectric ring 6 and the closed superconducting loop 8, a better magnetic shielding ratio can be achieved.

Figure 9:
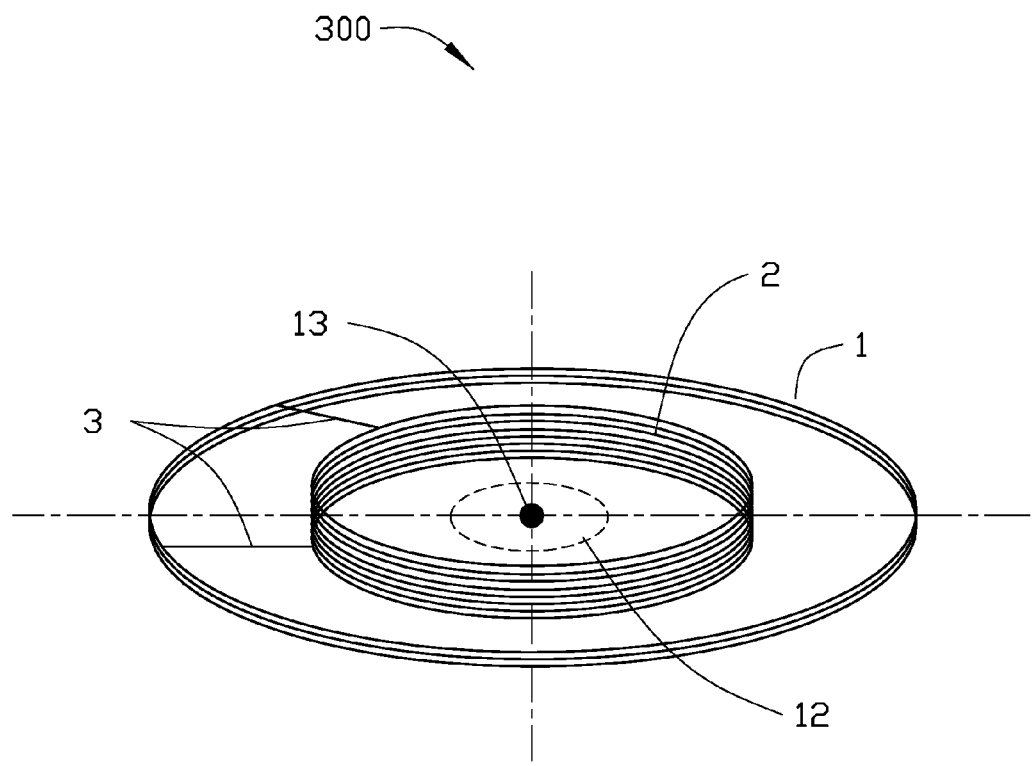
FIG. 9 shows a schematic view of one embodiment of a magnetic filed shielding system.

Referring to FIG. 9, one embodiment of a magnetic field shielding system 300 is provided. The magnetic field shielding system 300 is similar to the magnetic field system 100, except that the first stage superconducting coil 1 has the plurality of coils stacked together to form a pancake coil, and the second stage superconducting coil 2 has the plurality coils spirally stacked together to form a spiral coil.

Figure 10:
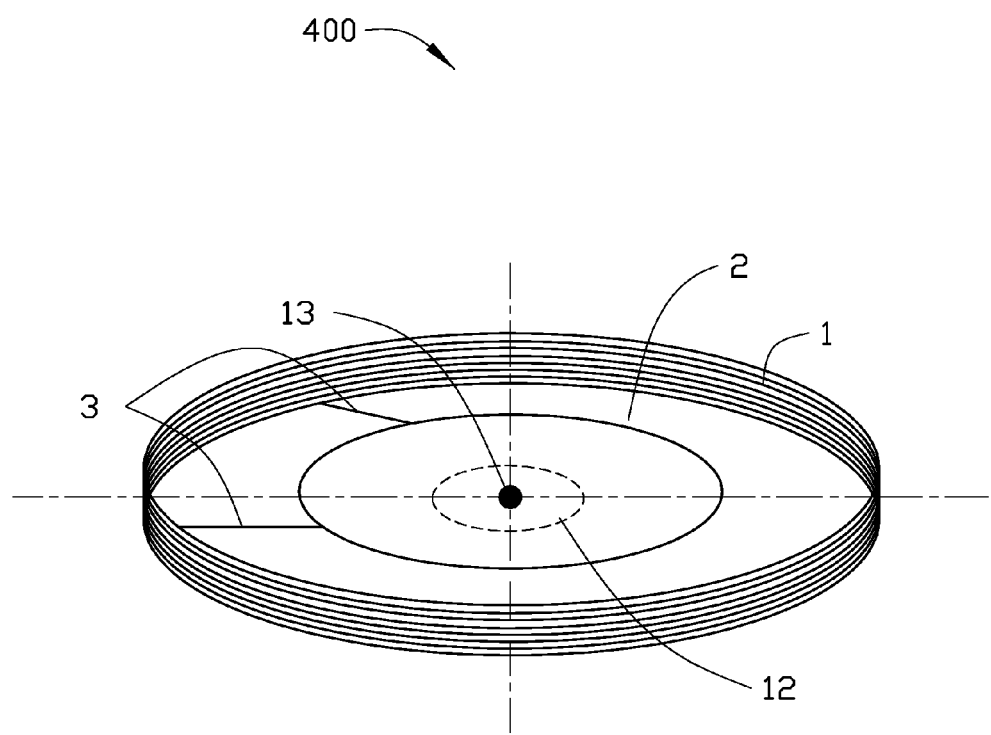
FIG. 10 shows a schematic view of one embodiment of a magnetic filed shielding system.

Referring to FIG. 10, one embodiment of a magnetic field shielding system 400 is provided. The magnetic field shielding system 400 is similar to the magnetic field shielding system 100, except that the first stage superconducting coil 1 comprises a plurality of coils spirally stacked together, and the second stage superconducting coil 2 comprises a plurality coils spirally arranged from the inside out to the outside in a plane to form a pancake structure. The first stage superconducting coil 1 and the second stage superconducting coil 2 are still connected in series through the connection wire 3 to form the closed loop. The first stage superconducting coil 1, the second stage superconducting coil 2, and the connecting cable 3 can be connected via the conventional soldering techniques.

Figure 11:
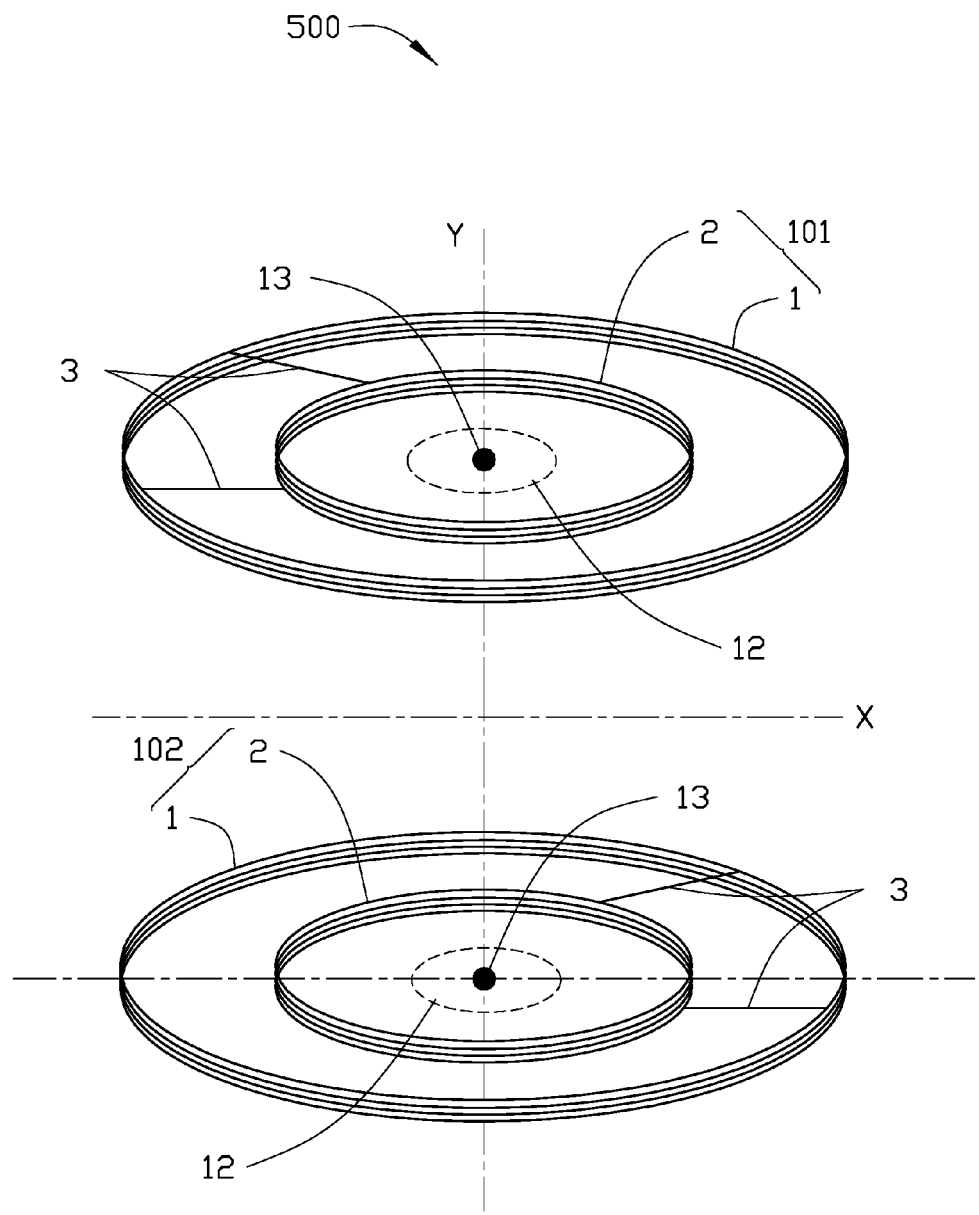
FIG. 11 shows a schematic view of one embodiment of a magnetic filed shielding system.

Referring to FIG. 11, one embodiment of a magnetic field shielding system 500 is provided. The magnetic field shielding system 500 comprises a first coil group 101 and a second coil group 102 spaced and insulated from each other. Both the first coil group 101 and the second coil group 102 comprise a first stage superconducting coil 1 and a second stage superconducting coil 2. The first stage superconducting coil 1 and the second stage superconducting coil 2 are coplanar, and coaxial located around the same central axis. The first coil group 1 is parallel with the second coil 2, thus a first plane wherein the first coil group located is parallel with a second plane wherein the second coil group is located. Furthermore, the first coil group 1 and the second coil 2 are coaxial located. Both the first coil group 101 and the second coil group 102 are similar to the magnetic field shielding system 100.

The distance between the first coil group 101 and the second coil group 202 can be selected according to the requirement of the shielded instrument or object. In the first coil group 101, the first stage superconducting coil 1 and second stage superconducting coil 2 are electrically connected in series. In the second coil group 102, the first stage superconducting coil 1 and the second stage superconducting coil 2 are also electrically connected in series. The first coil group 101 and the second coil groups 202 are insulated from each other. Assuming that the first coil group 101 and the second coil group 102 are symmetry located around the Y-axis, the X-axis is perpendicular with the Y-axis and intersected with the Y-axis at the point o. Thus the first coil group 101 and the second coil group 102 are placed at opposite sides of the X-axis, and located in mirror symmetry. The first coil group 101 and the second coil group 102 are coaxially disposed along the Y-axis. A uniform field region 12 can be formed both in the center of the second stage superconducting coil 2 in the first coil group 101 and the center of the second stage superconducting coil 2 in the second coil group 102.

Figure 12:
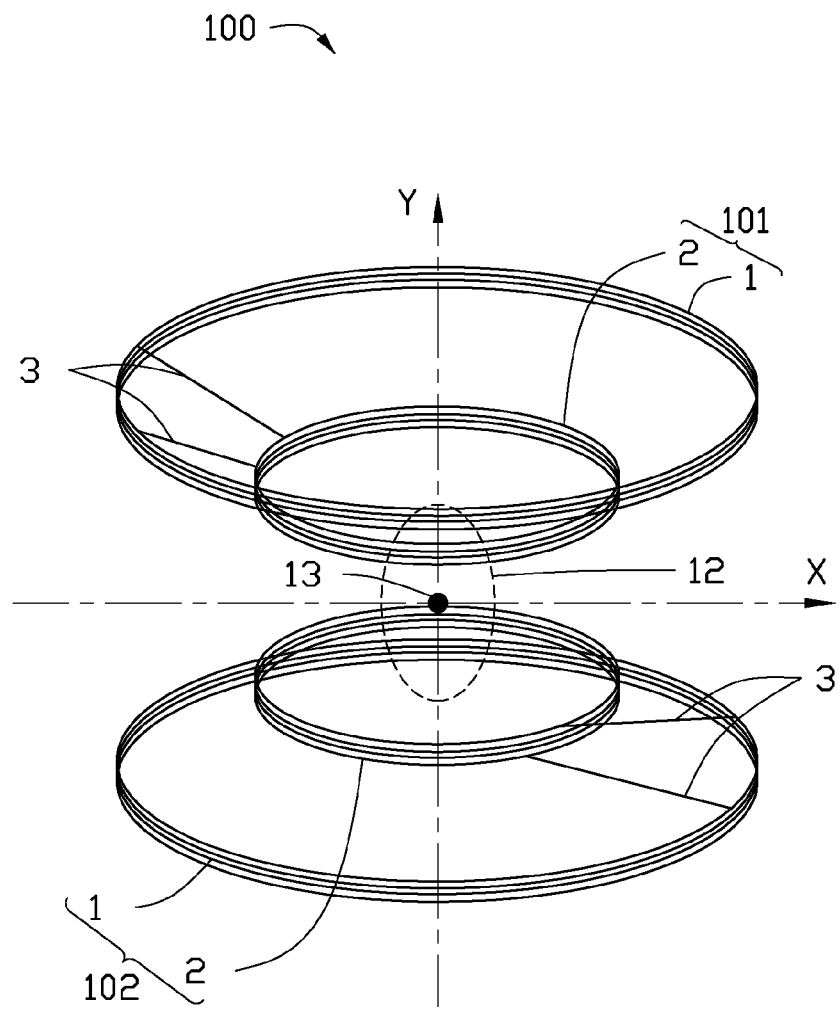
FIG. 12 shows a schematic view of one embodiment of a magnetic filed shielding system.

Referring to FIG. 12, one embodiment of magnetic field shielding system 500 comprises a first coil group 101 and a second coil group 102 spaced and insulated from each other. Both the first coil group 101 and the second coil group 102 comprise a first stage superconducting coil 1 and the second stage superconducting coil 2 coaxially disposed around a central symmetry axis. The four coils are located in different planes and parallel to each other. The second stage superconducting coils 2 in the first coil group 1 and the second coil group 2 are spaced and insulated from each other. A uniform field region 12 is defined between the second stage superconducting coils 2 to shield the external magnetic field.

Furthermore, the shape of the uniform field region 12 can be selected according to a first distance between the two first stage superconducting coils 1, and a second distance between the two second stage superconducting coils 2. Assuming the first distance is $2h_1$, and the second distance is $2h_2$, thus the distance between the first stage superconducting coil 1 and the X axis is $h_1$, and the distance between the second stage superconducting coil 2 and the X axis is $h_2$. Thus the parameters $R_1$, $h_1$, $R_2$, $h_2$ satisfy: $h_1/R_1 = h_2/R_2$. Therefore, the shape of the uniform field region is circular or elliptical. In one embodiment, $h_1 = R_1/2$, $h_2 = R_2/2$.

Figure 13:
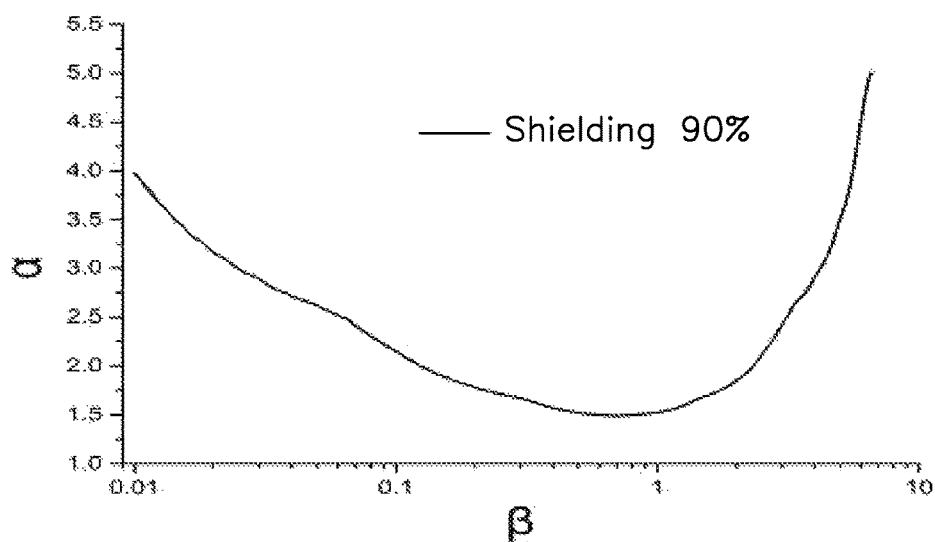
FIG. 13 shows a schematic graph of one embodiment of values ($\alpha$, $\beta$) at shielding 90% magnetic field conditions.
Figure 14:
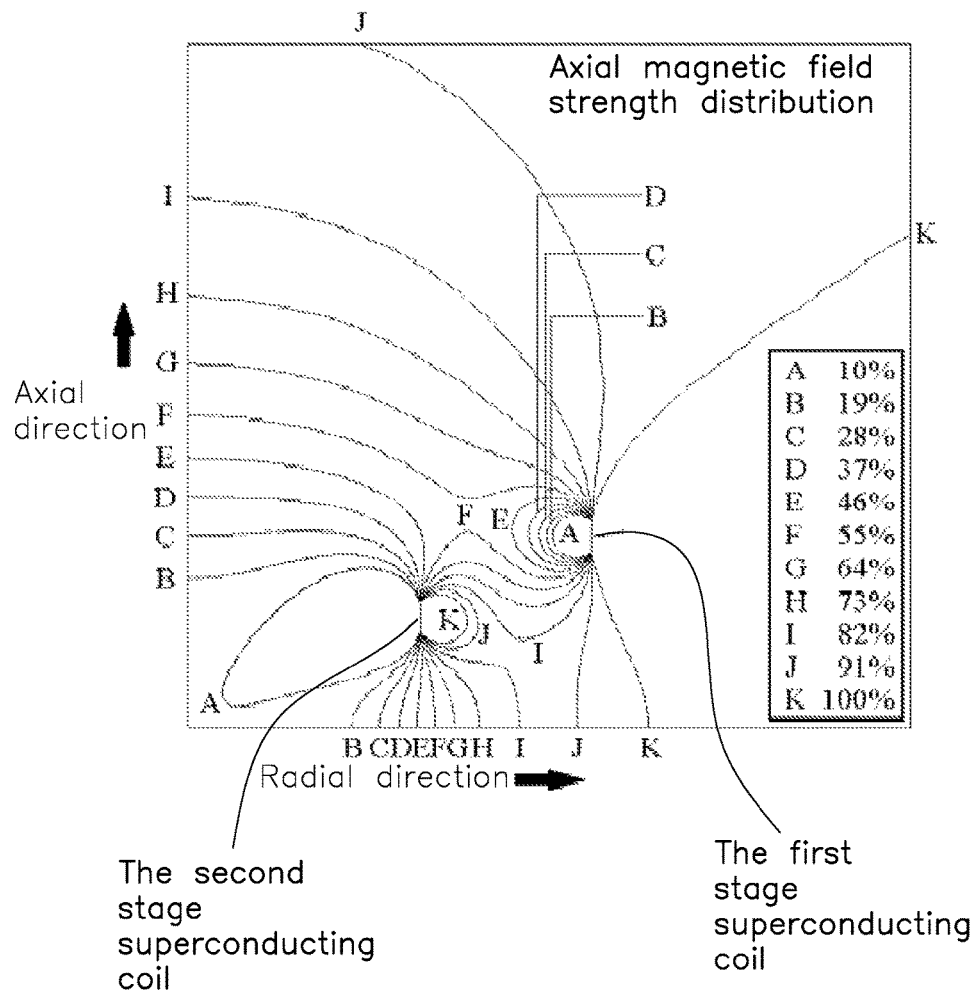
FIG. 14 shows a schematic graph of a shielding effect at center position of the magnetic filed shielding system in FIG. 12 with changing a relative position between a first stage superconducting coil and a second stage superconducting coil along an axial direction.

Referring to FIG. 13, the magnetic shield effect can reach 90% along the line. In one embodiment, $\alpha = 2.3$, $\beta = 1$. In this case, the magnetic shielding effect of the shielding system 500 can be shown in FIG. 14. Thus, the uniformity of the magnetic field have a larger space along the axial direction (Y-axis direction), and the magnetic field shielding area of the magnetic shielding system 500 has a large space.

Furthermore, the size of the first stage superconducting coil 1 can be less than the size of the second stage superconducting coil 2. Furthermore, in order to form different topological space shield structure, the magnetic field shielding system 500 can further comprise another first stage superconducting coils (not shown) disposed outside the existing two first stage superconducting coils 1, and the plurality of superconducting coils are coaxially placed.

Figure 15:
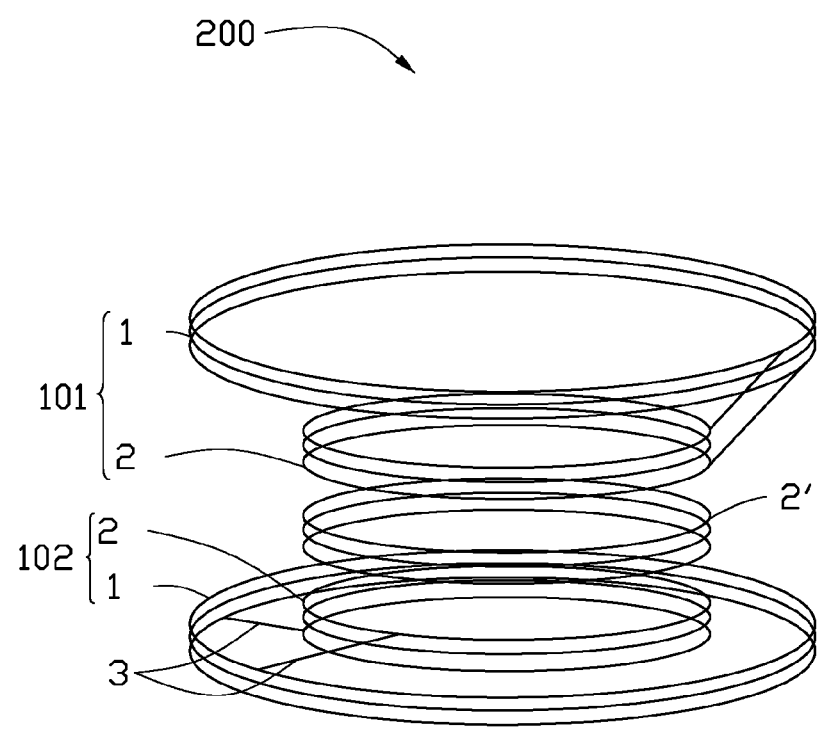
FIG. 15 shows a schematic view of one embodiment of a magnetic filed shielding system.

Referring to FIG. 15, one embodiment of a magnetic field shielding system 600, the magnetic field shielding system 600 comprises a first coil group 101, a second coil group 102, and a third stage superconducting coil 2'. The structure of magnetic field shielding system 600 is similar to the magnetic field shielding system 500, except that the magnetic field shielding system 600 further comprises the third stage superconducting coil 2' located between the first coil group 101 and the second coil group 102. The third stage superconducting coil 2' is spaced and insulated from the first coil group 101 and the second coil group 102. The third stage superconducting coil 2' is coaxially placed with the second stage superconducting coil 2.

The third stage superconducting coil 2' has the same shape as the second stage superconducting coil 2. The size of the third stage superconducting coil 2' can be same as the first stage superconducting coil 1 or the second stage superconducting coil 2. The third stage superconducting coil 2' is located at the middle between the first coil group 1 and the second coil group 2. The third stage superconducting coil 2' can further enhance shielding effect of the magnetic field shielding system 600.

Figure 16:
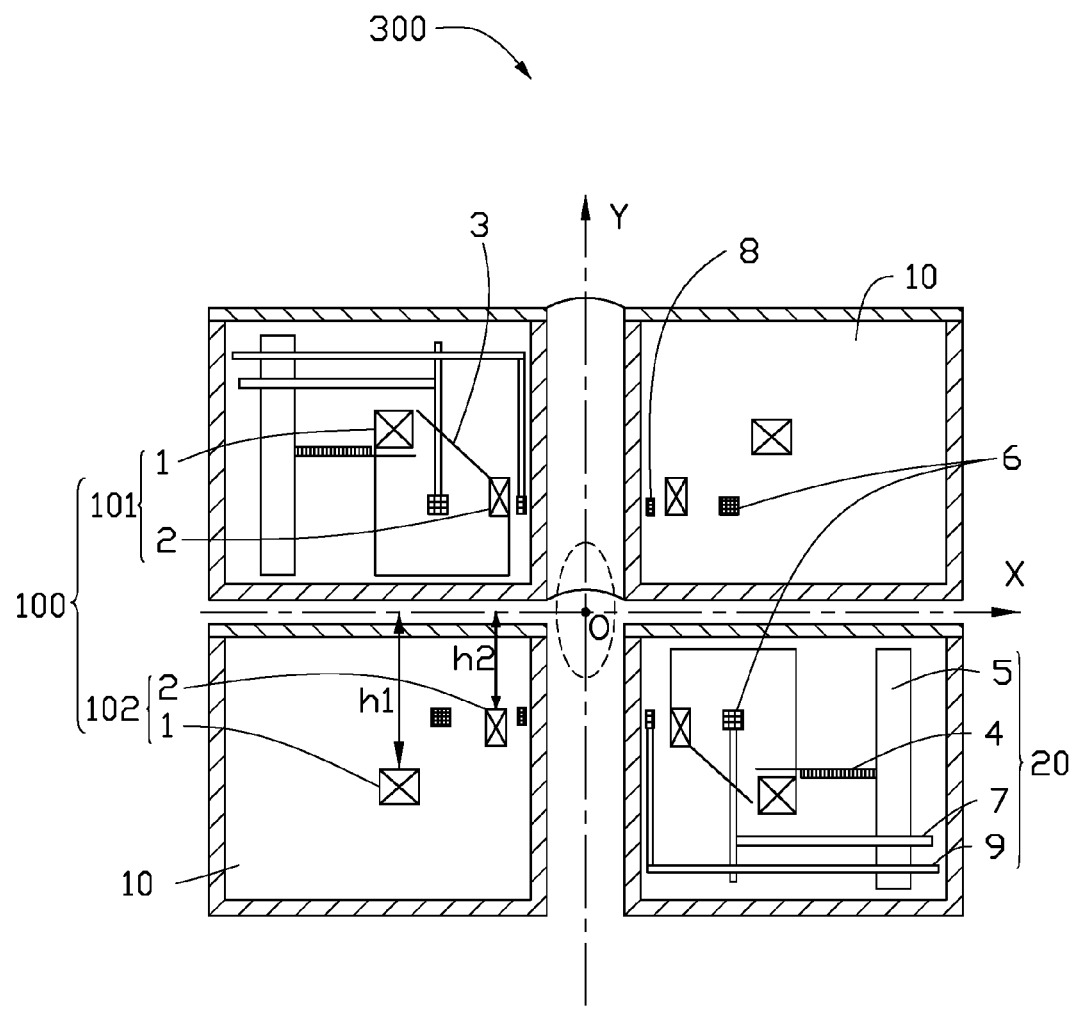
FIG. 16 shows a schematic view of one embodiment of a magnetic shielding device.

Referring to FIG. 16, one embodiment of a magnetic shielding device 620 comprises a dewar 10, a magnetic field shielding system 500, and a adjustment module 20. The magnetic field shielding system 500 is located in the dewar 10.

The magnetic field shielding system 500 is the magnetic field shielding system 500 in FIG. 12. The magnetic field shielding system 500 comprises the first coil group 101 and the second group 102 spaced and insulated from each other. The first coil group 101 and the second group 102 are located inside the dewar 10, and immersed in the cryogenic material. Both the first coil group 101 and the second coil group 102 surround the room temperature cavity 11. In one embodiment, the first coil group 101, the second coil group 102, and the dewar 10 are coaxially located along the same central symmetry axis to shield internal instrument or device.

The first coil group 101 and the second coil group 102 can be located in single dewar 10. Furthermore, the first coil group 101 and the second coil group 102 can be located in different dewar 10. In one embodiment, the first coil group 101 is located in one dewar 10, and the second coil group 102 are located in another dewar 10. The first coil group 101 and the second coil group 102 are symmetrically arranged at two opposite sides of the X-axis.

The adjustment module 20 is used to support the coils, and controls the relative position between the first stage superconducting coil 1 and second stage superconducting coils 2 along the central symmetry axis. In one embodiment, the magnetic field shielding device 620 comprises two adjustment modules 20 to control the first coil group 101 and the second coil group 102 respectively. Furthermore, each magnetic field shielding system 500 in the magnetic field shielding device 620 can further comprises a ferromagnetic dielectric ring 6. The ferromagnetic dielectric ring 6, the first stage superconducting coil 1 and the second stage superconducting coil 2 can be coaxially located around the central axis.

Figure 17:
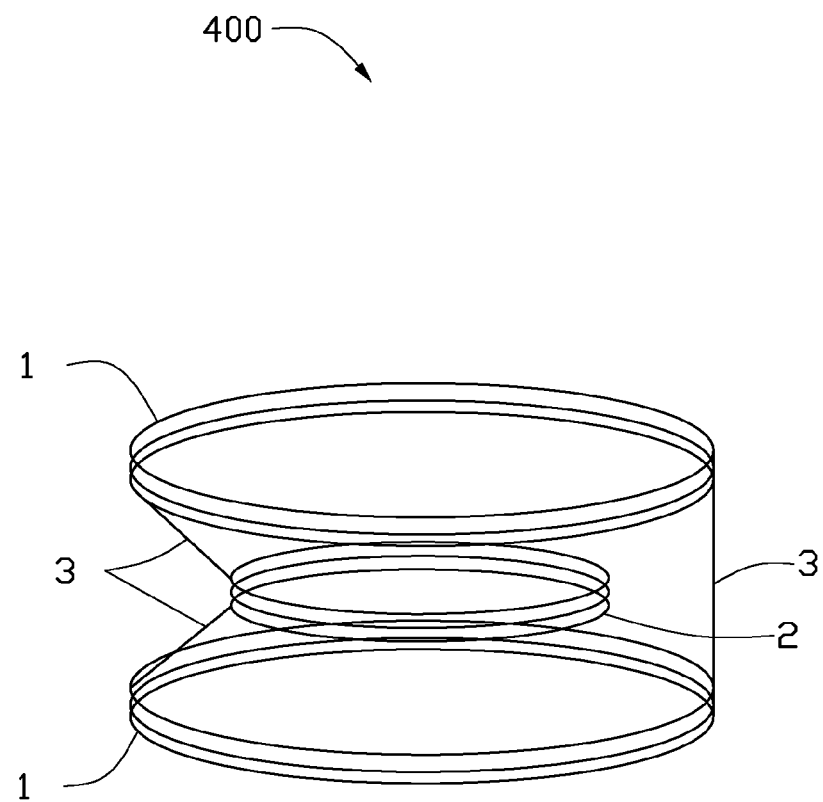
FIG. 17 shows a schematic view of one embodiment of a magnetic filed shielding system.

Referring to FIG. 17, one embodiment of a magnetic field shielding system 700 comprises two first stage superconducting coils 1 and a second stage superconducting coil 2. The two first stage superconducting coils 1 are spaced from each other, and the second stage superconducting coil 2 is located between the two first stage superconducting coils 1. The two first stage superconducting coils 1 and the second stage superconducting coil 2 are parallel with each other and coaxially disposed along the same central symmetry axis. The two first stage superconducting coils 1 and the second stage superconducting coil 2 are electrically connected to each other via a plurality of connecting wire 3 to form a closed loop. In one embodiment, the two first stage superconducting coils 1 are symmetric to each other relative to the second superconducting coil 2.

The first stage superconducting coil 1 and the second stage second superconducting coil 2 are electrically connected in series. In detail, two opposite ends of one of the first stage superconducting coil 1 is defined as a1 and a2, two opposite ends of another first stage superconducting coil 1 is defined as b1 and b2, and two opposite ends of the second stage superconducting coil 2 is defined as c1 and c2. Thus the two first stage superconducting coil 1 and the second stage superconducting coil 2 are connected in a manner of a1-c1-c2-b1-b2-a2-a1-c1 to form the closed loop.

Furthermore, two third stage superconducting coils (not shown) can be located outside of the two first stage superconducting coils 1 respectively. The third stage superconducting coil can be same as or different from the first stage superconducting coil 1. The two third stage superconducting coils, the two first stage superconducting coil 1, and the second stage superconducting coil 2 are coaxially located. The two third stage superconducting coils, the two first stage superconducting coils 1 two are symmetrically located respect to the second stage superconducting coil 2. The two third stage superconducting coils, the two first stage superconducting coil 1, and the second stage superconducting coil 2 are electrically connected in series to form the closed loop. Furthermore, the size and shape of the third stage superconducting coil can also be same as the second stage superconducting coil 2. It can be understood that, there can also be a plurality of third stage superconducting coils are symmetrically located on two opposite outsides of the two first stage superconducting coils 1 respect to the second stage superconducting coil 2, in order to ensure that the number of superconducting coils in the magnetic field shielding system 700 is always an odd number.

Figure 18:
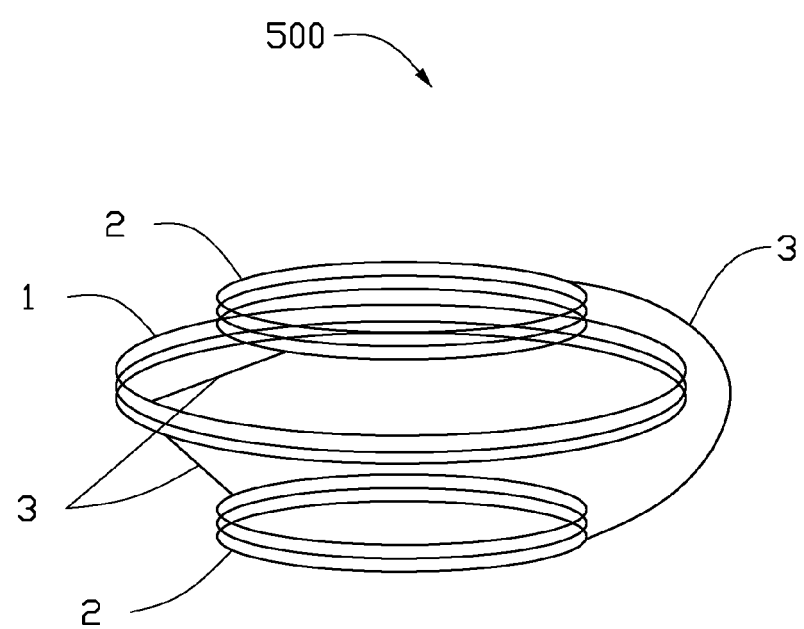
FIG. 18 shows a schematic view of one embodiment of a magnetic filed shielding system.

Referring to FIG. 18, one embodiment of a magnetic field shielding system 500, the magnetic field shielding system 800 comprises a first stage superconducting coil 1 and two second stage superconducting coils 2 spaced from each other. The first stage superconducting coil 1, the two second stage superconducting coils 2 are parallel with each other and coaxially located along a central symmetry axis. The first stage superconducting coil 1 is located between the two second stage superconducting coils 2. Furthermore, the first stage superconducting coil 1 and the two second stage superconducting coil 2 can be electrically connected in series via a plurality of connecting wires to form the closed loop.

The magnetic field shielding system 800 is similar to the magnetic field shielding system 700, except that the two second stage superconducting coils 2 with smaller size are located two opposite sides of the first stage superconducting coil 1 with lager size.

Figure 19:
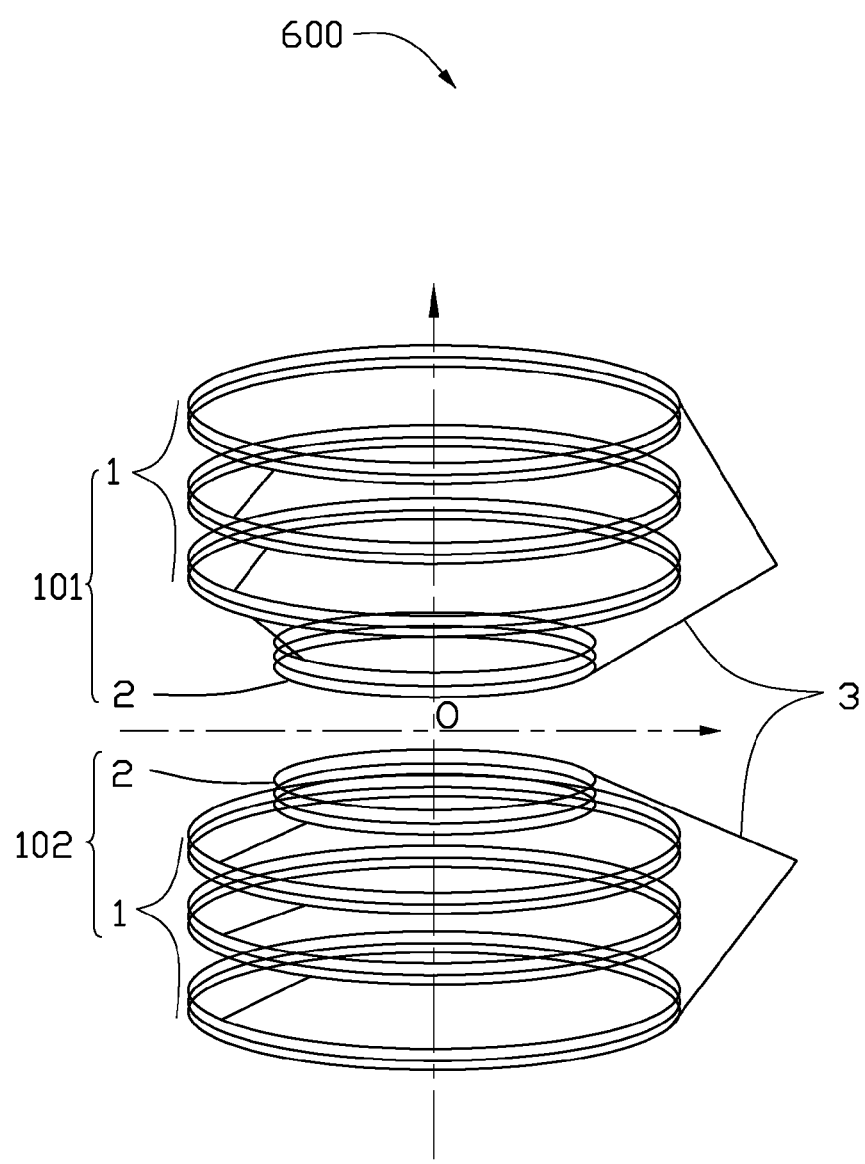
FIG. 19 shows a schematic view of one embodiment of a magnetic filed shielding system.

Referring to FIG. 19, one embodiment of a magnetic field shielding system 510 comprises a first coil group 101 and a second coil group 102. The magnetic field shielding system 510 comprises 2N superconducting coils, wherein N is greater than or equal to 2. Each of the first coil group 101 and the second coil group 102 comprises N superconducting coils. The N superconducting coils are spaced from and parallel with each other. The N superconducting coils are electrically connected in series via a plurality of connecting wires 3 to form a closed loop. The N superconducting coils comprise a plurality of first stage superconducting coils 1 and a plurality of second stage superconducting coils 2. The first coil group 101 and the second coil group 102 are symmetrically placed. Thus the N superconducting coils in the first coil group 1 and the second coil group 2 are symmetrically placed. A symmetry center is defined between the first coil group 1 and the second coil group 2. The symmetry center is configured as a shielding center of magnetic field shielding system 510. In one embodiment, the N superconducting coils comprise one first stage superconducting coil 1 and N−1 second stage superconducting coil 2.

Figure 20:
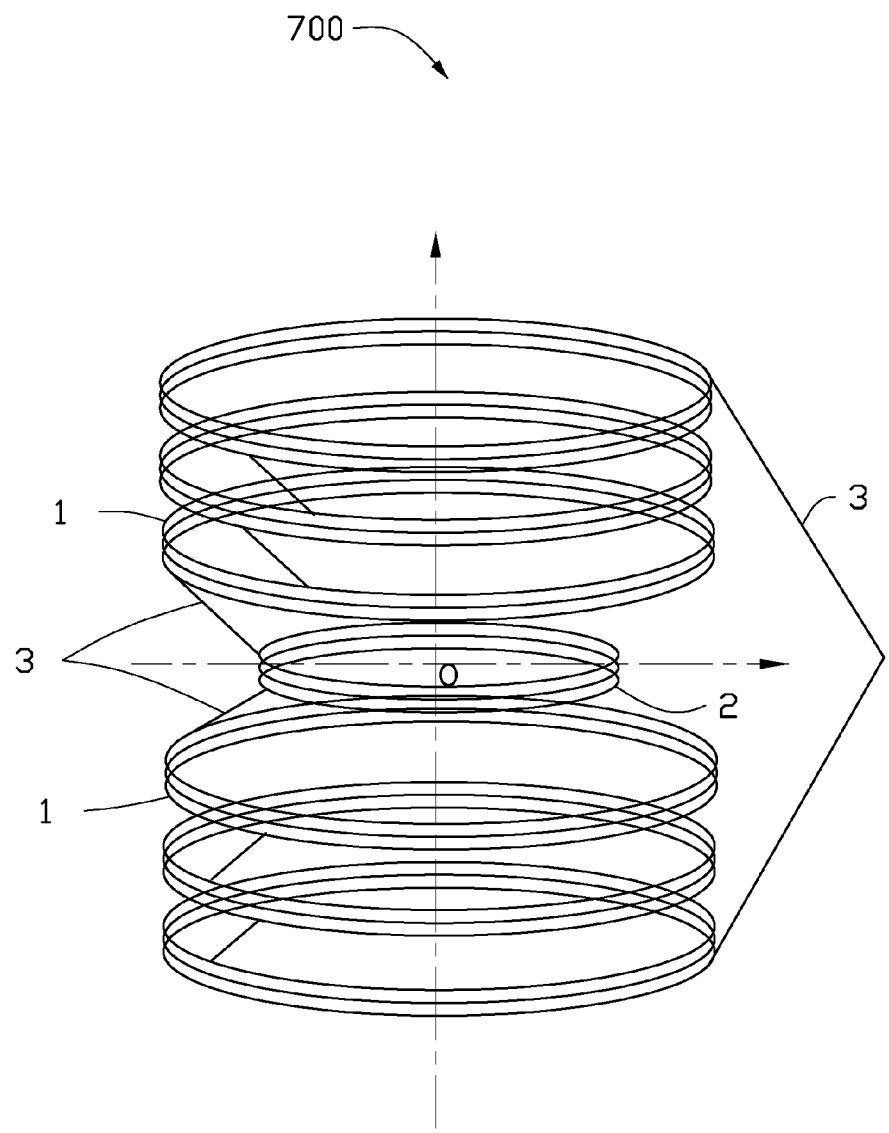
FIG. 20 shows a schematic view of one embodiment of a magnetic filed shielding system.

Referring to FIG. 20, one embodiment of a magnetic field shielding system 710 comprise N superconducting coils, where N is an odd number which is greater than or equal to 3. The N superconducting coils are coaxially located and parallel with each other. The N superconducting coils are electrically connected in series via a plurality of connecting wires 3 to form a closed loop. The N superconducting coils comprise a plurality of first stage superconducting coils 1 and a plurality of second stage superconducting coils 2. One of the N superconducting coils is selected to be located at the middle position, and other N−1 superconducting coils are located at two opposite sides of the selected one of the N superconducting coils. Furthermore, the other N−1 superconducting coils are symmetrically distributed at two opposite sides of the selected one of the N superconducting coils. A central point at the middle position is configured as the shielding center. In one embodiment, the selected one of the N superconducting coils is a first stage superconducting coil 1, and the other N−1 superconducting coils are a plurality of second stage superconducting coils 2.

The magnetic field shielding system and magnetic field shielding device have following advantages. The magnetic field shielding system and magnetic field shielding device is not required to be based on the Helmholtz coil structure, thus the structural connections and the complexity of the combination is significantly reduced, and the process is simplified. The magnetic field shielding system can provide different topological structure of the shield space. The magnetic filed shielding system provides a panoramic vision, and does not affect the optical detection. Furthermore, the magnetic filed shielding system can form a variety of topologies shielded space, the structure is simple, low in energy consumption, capable of being adjusted online, and flexible to be used.

Depending on the embodiment, certain of the steps of methods described may be removed, others may be added, and the sequence of steps may be altered. It is also to be understood that the description and the claims drawn to a method may comprise some indication in reference to certain steps. However, the indication used is only to be viewed for identification purposes and not as a suggestion as to an order for the steps.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A magnetic field shielding system comprising:
a first stage superconducting coil and a second stage superconducting coil;
wherein the first stage superconducting coil and the second stage superconducting coil are coaxial, coplanar and electrically connected in series to form a closed loop; the first stage superconducting coil has a first radius R1, the second stage superconducting coil has a second radius R2, and R1>R2; a radius ratio $\alpha$ between the first radius R1 and the second radius R2 is: $\alpha = R1/R2$; the first stage superconducting coil has N1 turns; the second stage superconducting coil has N2 turns; a turns ratio $\beta$ between N1 and N2 is: $\beta = N1/N2$; and the radius ratio $\alpha$ satisfies: $\alpha \geq 2$; the turns ratio $\beta$ satisfies: $0.01 \beta \leq 20$.

2. The magnetic field shielding system of claim 1, wherein the first stage superconducting coil and the second stage superconducting coil are concentric.

3. The magnetic field shielding system of claim 1, wherein each of the first stage superconducting coil and the second stage superconducting coil is formed by a single superconducting wire spiral wounded around a central symmetry axis.

4. The magnetic field shielding system of claim 1, wherein the first stage superconducting coil comprises a first end and a second end, the second stage superconducting coil comprises a third end and a fourth end, the first end is connected to the third end, and the second end is connected to the fourth end to form the closed loop.

5. The magnetic field shielding system of claim 1, wherein the turns N2 of the second stage superconducting coil satisfies:

$$N2 > \sqrt{\frac{mR}{L\omega}};$$

wherein, R is a connecting resistance between the first stage superconducting coil and the second stage superconducting coil; L is an inductance of a single-turn coil of the second stage superconducting coil, $\omega$ is an angular frequency of a magnetic field, and m is a ratio coefficient between $\omega L$ and R.

6. The magnetic field shielding system of claim 1, wherein one of the first stage superconducting coil and the second stage superconducting coil comprises a plurality of pancake-shaped coils, and another one of the first stage superconducting coil and the second stage superconducting coil comprises a plurality of solenoid-shaped coils.

7. A magnetic field shielding system comprising:
a first coil group and a second coil group;
wherein the first coil group and the second coil group are spaced and insulated from each other; the first coil group and the second coil group are coaxial; each of the first coil group and the second group comprises a first stage superconducting coil and a second stage superconducting coil; and the first stage superconducting coil and the second stage superconducting coil are coaxial and electrically connected in series to form a closed loop; the first stage superconducting coil and the second stage superconducting coil are coplanar.

8. The magnetic field shielding system of claim 7, wherein the first stage superconducting coil and the second stage superconducting coil are spaced from each other.

9. The magnetic field shielding system of claim 7, wherein a first size of the first stage superconducting coil is greater than a second size of the second stage superconducting coil, and the second stage superconducting coil is located inside the first stage superconducting coil.

10. The magnetic field shielding system of claim 7, further comprises a third stage superconducting coil located at the middle between the first coil group and the second coil group.

11. The magnetic field shielding system of claim 10, wherein the third stage superconducting coil is spaced and insulated from the first coil group and the second coil group; the first stage superconducting coil, the second stage superconducting coil, and the third stage superconducting coil are coaxial and parallel with each other.

12. The magnetic field shielding system of claim 10, wherein the first coil group and the second coil group are symmetric with each other respect to the third stage superconducting coil.

13. The magnetic field shielding system of claim 10, wherein the third stage superconducting coil is electrically connected in series between the first coil group and the second coil group.

14. A magnetic field shielding device comprising:
a dewar, wherein the dewar is a hollow structure comprising an inner wall and an outer wall spaced from each other, and the inner wall and the outer wall are located around the same central symmetry axis;
a magnetic field shielding system accommodated in the dewar, wherein the magnetic field shielding system comprises a first coil group comprising a first stage superconducting coil and a second stage superconducting coil coaxially located around the central symmetry axis, the first stage superconducting coil and the second stage superconducting coil are located between the inner wall and the outer wall; and
an adjustment module connected to the magnetic field shielding system, wherein the adjustment module comprises a first connecting rod and a second connecting rod configured to adjust a relative position between the first stage superconducting coil and the second stage superconducting coil, the first connecting rod is connected to the first stage superconducting coil, and the second connecting rod is connected to the second stage superconducting coil.

15. The magnetic field shielding device of claim 14, wherein the first stage superconducting coil and the second stage superconducting coil are coplanar and spaced from each other.

16. The magnetic field shielding device of claim 14, further comprising a ferromagnetic dielectric ring coaxially located with the first stage superconducting coil and the second stage superconducting coil, wherein the ferromagnetic dielectric ring is spaced from the first stage superconducting coil and the second stage superconducting coil, and the ferromagnetic dielectric ring defines a notch.

17. The magnetic field shielding device of claim 14, further comprising a closed superconducting loop coaxially located with the first stage superconducting coil and the second stage superconducting coil, wherein the closed superconducting loop is spaced from the first stage superconducting coil and the second stage superconducting coil.

18. The magnetic field shielding device of claim 14, further comprising a second coil group spaced and insulated from the first coil group, wherein the second coil group comprises a third superconducting coil and a fourth stage superconducting coil coaxially located the central symmetry axis and parallel with each other; the third stage superconducting coil is the same as the first superconducting coil, and the fourth stage superconducting coil is the same as the second superconducting coil; and the first coil group and the second coil group are symmetrically located with each other.

19. The magnetic field shielding device of claim 18, wherein the first stage superconducting coil is parallel with the second stage superconducting coil, and the third stage superconducting coil is parallel with the fourth stage superconducting coil; and the first stage superconducting coil, the second stage superconducting coil, the third stage superconducting coil, and the fourth superconducting coil are symmetrically located, the second stage superconducting coil and the third stage superconducting coil are located between the first superconducting coil and the fourth superconducting coil.

* * * * *